(12) United States Patent
Mori et al.

(10) Patent No.: US 8,766,203 B2
(45) Date of Patent: Jul. 1, 2014

(54) SOLID STATE IMAGING DEVICE

(75) Inventors: Harumichi Mori, Hamamatsu (JP);
Kazuki Fujita, Hamamatsu (JP); Ryuji Kyushima, Hamamatsu (JP)

(73) Assignee: Hamamatsu Photonics K.K., Hamamatsu-shi, Shizuoka (JP)

( * ) Notice: Subject to any disclaimer, the term of this patent is extended or adjusted under 35 U.S.C. 154(b) by 267 days.

(21) Appl. No.: 12/679,750

(22) PCT Filed: Sep. 24, 2008

(86) PCT No.: PCT/JP2008/067187
§ 371 (c)(1),
(2), (4) Date: Mar. 24, 2010

(87) PCT Pub. No.: WO2009/041434
PCT Pub. Date: Apr. 2, 2009

(65) Prior Publication Data
US 2010/0193692 A1 Aug. 5, 2010

(30) Foreign Application Priority Data

Sep. 25, 2007 (JP) ................. P2007-247645

(51) Int. Cl.
*G01T 1/24* (2006.01)
(52) U.S. Cl.
USPC .................................. 250/370.11
(58) Field of Classification Search
USPC .................................. 250/370.11
See application file for complete search history.

(56) References Cited

U.S. PATENT DOCUMENTS

| 2002/0153491 A1* | 10/2002 | Sugawara et al. | 250/370.09 |
| 2004/0056204 A1* | 3/2004 | Tanaka et al. | 250/370.09 |
| 2007/0075252 A1* | 4/2007 | Misawa | 250/370.11 |
| 2007/0176109 A1* | 8/2007 | Bell | 250/370.09 |

FOREIGN PATENT DOCUMENTS

| JP | 2001-42042 | 2/2001 |
| JP | 2003-133575 | 5/2003 |
| JP | 2004-177217 | 6/2004 |
| JP | 2006-64525 | 3/2006 |

* cited by examiner

*Primary Examiner* — Constantine Hannaher
(74) *Attorney, Agent, or Firm* — Drinker Biddle & Reath LLP

(57) ABSTRACT

A solid state imaging device 1 includes a photodetecting section 10, a signal readout section 20, a controlling section 30, dummy photodetecting sections 11 and 12 including dummy photodiodes, discharging arrangement for discharging junction capacitance portions of the dummy photodiodes, and a scintillator layer 50 provided so as to cover the photodetecting section 10. The dummy photodetecting section 11 is disposed so as to neighbor the first row (the upper side of the photodetecting section 10) of the photodetecting section 10 and has a length equivalent to the length of the photodetecting section 10 in the left-right direction. The dummy photodetecting section 12 is disposed so as to neighbor the M-th column of the photodetecting section 10 (the lower side of the photodetecting section 10) and has a length equivalent to the length of the photodetecting section 10 in the left-right direction.

20 Claims, 9 Drawing Sheets

SOLID STATE IMAGING DEVICE

TECHNICAL FIELD

The present invention relates to a solid state imaging device.

BACKGROUND ART

A solid state imaging device is used for imaging radiation such as X-rays, and is also used for, for example, medical purposes such as dental purposes. Such a solid state imaging device includes a photodetecting section including M×N pixel portions $P_{1,1}$ to $P_{M,N}$ two-dimensionally arrayed in M rows and N columns, each including a photodiode, a scintillator layer provided so as to cover the photodetecting section, a signal readout section which outputs voltage values corresponding to amounts of charges generated in the photodiodes included in the pixel portions of the photodetecting section, and a controlling section which controls operations of the photodetecting section and signal readout section, etc. In the solid state imaging device, the photodetecting section, the signal readout section, and the controlling section, etc., may be formed on a semiconductor substrate.

In this solid state imaging device, scintillation light is generated in response to incidence of radiation on the scintillator layer, and in response to incidence of the scintillation light on the photo diode included in any of the pixel portions of the photodetecting section, charges are generated in this photodiode. Then, voltage values corresponding to amounts of charges generated in photodiodes included in the respective pixel portions of the photodetecting section are output from the signal readout section. Thus, a radiation image is obtained.

In such a solid state imaging device, when radiation and scintillation light transmitted through the scintillator layer are made incident on a region (for example, regions of the signal readout section and controlling section, a field region for wire bonding, etc., hereinafter, these regions will be referred to as "peripheral regions") other than the photodetecting section, charges may be generated at this incidence position. Then, the charges generated in the peripheral region may move from the generation position and be accumulated in a junction capacitance portion of a photodiode included in any of the pixel portion of the photodetecting section. In this case, charges to be output from this pixel portion of the photodetecting section include not only charges generated in the photodiode in this pixel portion but also charges generated in the peripheral region as noise. Therefore, an accurate radiation image cannot be obtained.

An invention intended to solve this problem is disclosed in Patent Document 1. The solid state imaging device disclosed in this document includes a shielding member which blocks incidence of radiation on the peripheral region. This shielding member has an opening above the photodetecting section, and can allow radiation to be made incident on the scintillator layer provided on the photodetecting section.

Patent Document 1: Japanese Published Unexamined Patent Application No. 2004-177217

DISCLOSURE OF THE INVENTION

Problem to be Solved by the Invention

However, in the solid state imaging device of the invention disclosed in Patent Document 1, even if a shielding member is provided, when radiation is made incident on the scintillator layer or the shielding member, scattered radiation is caused by the Compton effect. Scattered radiation caused by the Compton effect has energy lower than that of incident radiation, so that it is greatly absorbed by silicon of the circuit of the solid state imaging device. Therefore, noise caused by incidence of such scattered radiation and scintillation light on the peripheral region cannot be sufficiently prevented. When the area of the peripheral region is large, noise is especially easily caused.

The present invention was made for solving the problem described above, and an object thereof is to provide a solid state imaging device which can sufficiently suppress influence of generation of charges in the peripheral region.

Means for Solving the Problem

A solid state imaging device of the present invention includes: (1) a photodetecting section including M×N pixel portions two-dimensionally arrayed in M rows and N columns, each including a photodiode which generates charges as much as incident light intensity and a switch connected to the photodiode, where the photodiode is connected to a readout wiring $L_{O,n}$ via the switch in each pixel portion $P_{m,n}$; (2) a scintillator layer which is provided so as to cover the photodetecting section and generates scintillation light in response to incidence of radiation; (3) a dummy photodetecting section including dummy photodiodes disposed so as to neighbor the outer sides of the first row and the M-th row of the photodetecting section; (4) a signal readout section which is provided at the outer side of the first row or the M-th row of the photodetecting section, includes N integrating circuits $S_1$ to $S_N$ and N holding circuits $H_1$ to $H_N$, accumulates charges input into each integrating circuit $S_n$ through the readout wiring $L_{O,n}$ in a capacitive element and outputs a voltage value corresponding to the accumulated charge amount, and holds the voltage value output from the integrating circuit $S_n$ in each holding circuit $H_n$ and outputs the voltage value; and (5) discharging means for discharging junction capacitance portions of the dummy photodiodes. M and N are integers not less than 2, m is an integer not less than 1 and not more than M, and n is an integer not less than 1 and not more than N. M is smaller than N, and the photodetecting section is long in one direction.

In this solid state imaging device, scintillation light is generated in response to incidence of radiation on the scintillator layer, and in response to incidence of the scintillation light on a photodiode included in any of the pixel portions of the photodetecting section, charges are generated in this photodiode. Then, voltage values corresponding to the amounts of charges generated in the photodiodes included in the pixel portions of the photodetecting section are output from the signal readout section including integrating circuits and holding circuits. Thus, a radiation image is obtained. During this imaging, if radiation and scintillation light transmitted through the scintillator layer are made incident on a peripheral region (for example, the signal readout section, the controlling section, etc.) other than the photodetecting section, charges may be generated at this incidence position. These noise charges generated in the peripheral region may move from the generation position toward the photodetecting section. However, in the present invention, the dummy photodetecting section including dummy photodiodes is provided, so that the noise charges are accumulated in the junction capacitance portions of the dummy photodiodes. Then, the junction capacitance portions of the dummy photodiodes are discharged and initialized by the discharging means, so that entrance of the noise charges into the photodetecting sections can be suppressed.

In the solid state imaging device of the present invention, the discharging means preferably discharges the junction capacitance portion of the dummy photodiode by applying a fixed voltage to the dummy photodiode. Alternatively, in the solid state imaging device of the present invention, preferably, the dummy photodetecting section further includes dummy switches connected to the dummy photodiodes, and the dummy photodiode is connected to any of the N integrating circuits $S_1$ to $S_N$ by any of the N readout wirings $L_{O,1}$ to $L_{O,N}$ via the dummy switch, and the discharging means switches the dummy switch to a closed state, and discharges the junction capacitance portion of the dummy photodiode by discharging a capacitive element of the integrating circuit to which the dummy photodiode is connected among the N integrating circuits $S_1$ to $S_N$.

In the solid state imaging device of the present invention, preferably, the dummy photodetecting section includes dummy photodiodes disposed on a plurality of rows neighboring the first row and the M-th row of the photodetecting section. The area of a photosensitive region of one dummy photodiode is preferably larger than the area of a photosensitive region of one photodiode included in each pixel portion $P_{m,n}$. The dummy photodetecting section preferably further includes a dummy photodiode disposed so as to neighbor the outer side of the first column or the N-th column of the photodetecting section. In these cases, entrance of noise charges into the photodetecting section can be further suppressed.

Effect of the Invention

According to the present invention, influence of charge generation in peripheral regions can be sufficiently suppressed.

DESCRIPTION OF THE REFERENCE NUMERALS

Figure 1:
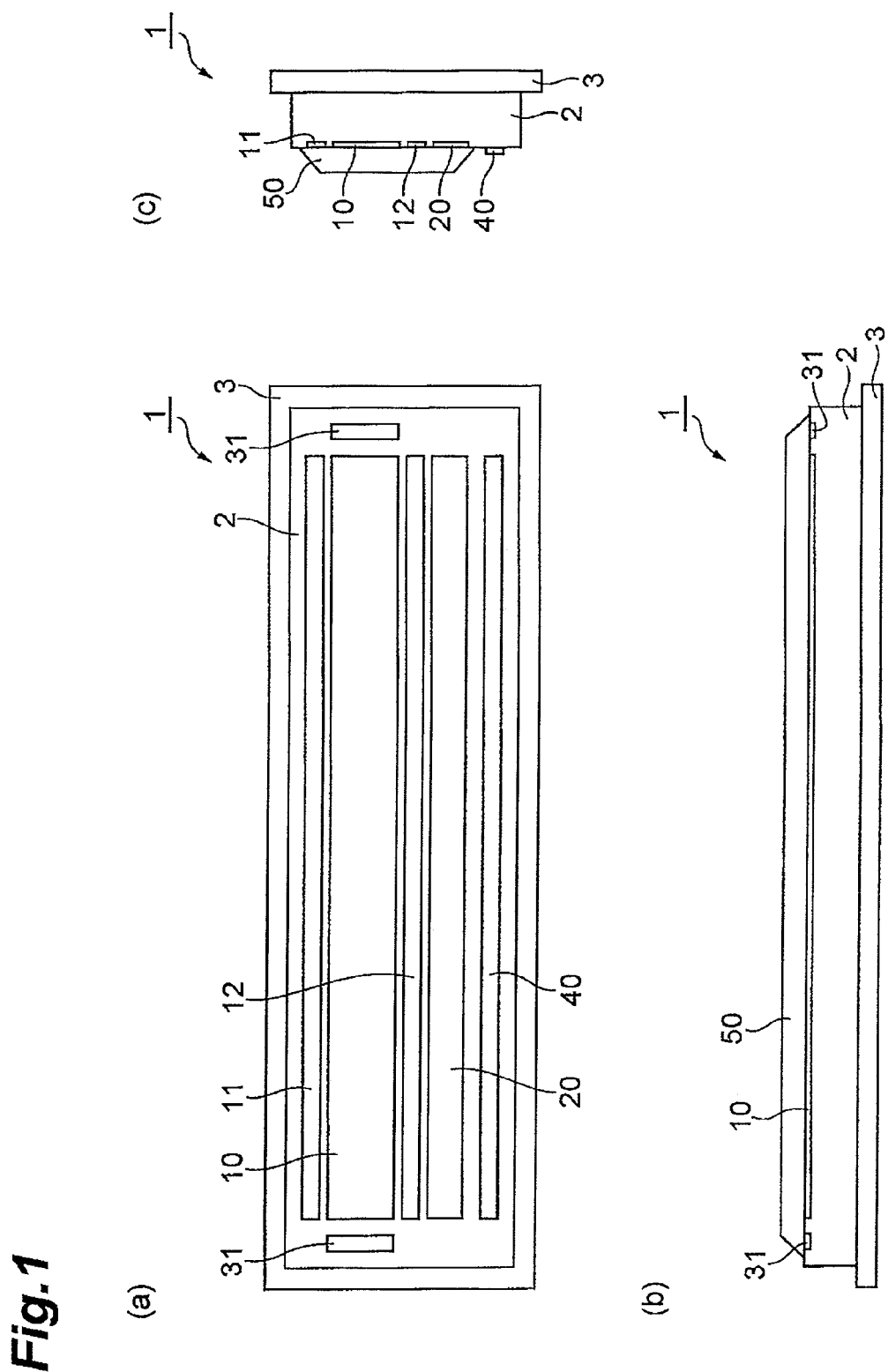
FIG. 1 shows a plan view and sectional views of a solid state imaging device 1 of the present embodiment.

1: Solid state imaging device
2: Semiconductor substrate
3: Base material
10: Photodetecting section
11, 12: Dummy photodetecting section
20: Signal readout section
30: Controlling section
31: Row selecting section
40: Bonding pad section
50: Scintillator layer
$P_{1,1}$ to $P_{M,N}$: Pixel portion
PD: Photodiode
$SW_1$: Switch
$D\text{-}P_{1,1}$ to $D\text{-}P_{4,N}$: Dummy pixel portion
D-PD: Dummy photodiode
D-SW: Dummy switch
$S_1$ to $S_N$: Integrating circuit
$C_2$: Integrating capacitive element
$SW_2$: Discharge switch
$A_2$: Amplifier
$H_1$ to $H_N$: Holding circuit
$C_3$: Holding capacitive element
$SW_{31}$: Input switch
$SW_{32}$: Output switch
$L_{O,n}$: n-th column readout wiring
$L_{bias}$: Bias voltage supply wiring
$L_{out}$: Voltage output wiring

BEST MODES FOR CARRYING OUT THE INVENTION

Hereinafter, a best mode for carrying out the present invention will be described with reference to the accompanying drawings. In the description of the drawings, the same components will be designated with the same reference numerals, and overlapping description will be omitted.

FIG. 1 shows a plan view and sectional views of a solid state imaging device 1 of the present embodiment. FIG. 1-(a) is a plan view, and FIG. 1-(b) and FIG. 1-(c) are sectional views. In the solid state imaging device 1 of the present embodiment, a base material 3 is stuck on the back surface of a semiconductor substrate 2 to reinforce the semiconductor substrate 2. On the surface of the semiconductor substrate 2, a photodetecting section 10, dummy photodetecting sections 11 and 12, a signal readout section 20, a row selecting section 31, and a bonding pad section 40, etc., are formed. The circuits on the surface of the semiconductor substrate 2 can be formed by the CMOS technique. On the surfaces of these, a scintillator layer 50 is provided.

The photodetecting section 10 includes M×N pixel portions $P_{1,1}$ to $P_{M,N}$ two-dimensionally arrayed in M rows and N columns, each including a photodiode and a switch. In the plan view of FIG. 1-(a), the first row in the photodetecting section 10 is on the upper side of the photodetecting section 10, and the M-th row in the photodetecting section 10 is on the lower side of the photodetecting section 10, the first column in the photodetecting section 10 is on the left side of the photodetecting section 10, and the N-th column in the photodetecting section 10 is on the right side of the photodetecting section 10. M and N are integers not less than 2. M is smaller than N, and in the plan view of FIG. 1-(a), the photodetecting section 10 is long in the left-right direction, and for example, the length in the left-right direction of the photodetecting section 10 is 148 millimeters, and the width in the up-down direction of the photodetecting section 10 is 6 millimeters.

The dummy photodetecting section 11 is disposed so as to neighbor the first row (the upper side of the photodetecting section 10) of the photodetecting section 10, and has a length equivalent to the length of the photodetecting section 10 in the left-right direction. The dummy photodetecting section 12 is disposed so as to neighbor the M-th row (on the lower side of the photodetecting section 10) of the photodetecting section 10, and has a length equivalent to the length of the photodetecting section 10 in the left-right direction. These dummy photodetecting sections 11 and 12 include dummy photodiodes. As described later, the dummy photodiodes are not used as light receiving elements, so that on the wholes or parts of the dummy photodetecting sections 11 and 12, shielding films which shield the signal readout section 20, etc., may be provided. The shielding films are formed of, for example, Al films formed via insulating films.

The signal readout section 20 is provided at the outer side of the M-th row of the photodetecting section 10. The dummy photodetecting section 12 is disposed between the signal readout section 20 and the photodetecting section 10. The row selecting section 31 is provided on both or either of the outer side of the first column of the photodetecting section 10 (the left side of the photodetecting section 10) and the outer side of the N-th column of the photodetecting section 10 (the right side of the photodetecting section 10). The bonding pad section 40 is provided on the lower side of the signal readout section 20.

The scintillator layer 50 is provided so as to cover at least the photodetecting section 10, and generates scintillation light in response to incidence of radiation such as X-rays, etc. The scintillator layer 50 is preferably provided so as to cover not only the photodetecting section 10 but also the dummy photodetecting sections 11 and 12, the signal readout section 20, and the row selecting section 31. The scintillator layer 50 is made of, for example, CsI, and formed on the surface of the semiconductor substrate 2 by vapor deposition. The scintillator layer 50 is not shown in FIG. 1-($a$).

This solid state imaging device 1 operates generally as follows under control by the controlling section including the row selecting section 31. Scintillation light is generated in response to incidence of radiation on the scintillator layer 50, and in response to incidence of the scintillation light on the photodiode included in any of the pixel portions of the photodetecting section 10, charges are generated in this photodiode. Then, voltage values corresponding to the amounts of charges generated in the photodiodes included in the respective pixel portions of the photodetecting section 10 are output from the signal readout section 20, and output to the outside through the bonding pad section 40. Thus, a radiation image is obtained.

If the radiation and scintillation light transmitted through the scintillator layer 50 are made incident on a region (peripheral region) other than the photodetecting section 10, charges may also be generated at the incidence position. Then, if the charges generated in the peripheral region move from the generation position and are accumulated in a junction capacitance portion of the photodiode included in any of the pixel portions of the photodetecting section 10, charges to be output from this pixel portion include not only the charges generated in the photodiode of this pixel portion but also charges generated in the peripheral region, and an accurate radiation image cannot be obtained. Therefore, in the present embodiment, in order to solve this problem, dummy photodetecting sections 11 and 12 each including dummy photodiodes are provided.

Figure 2:
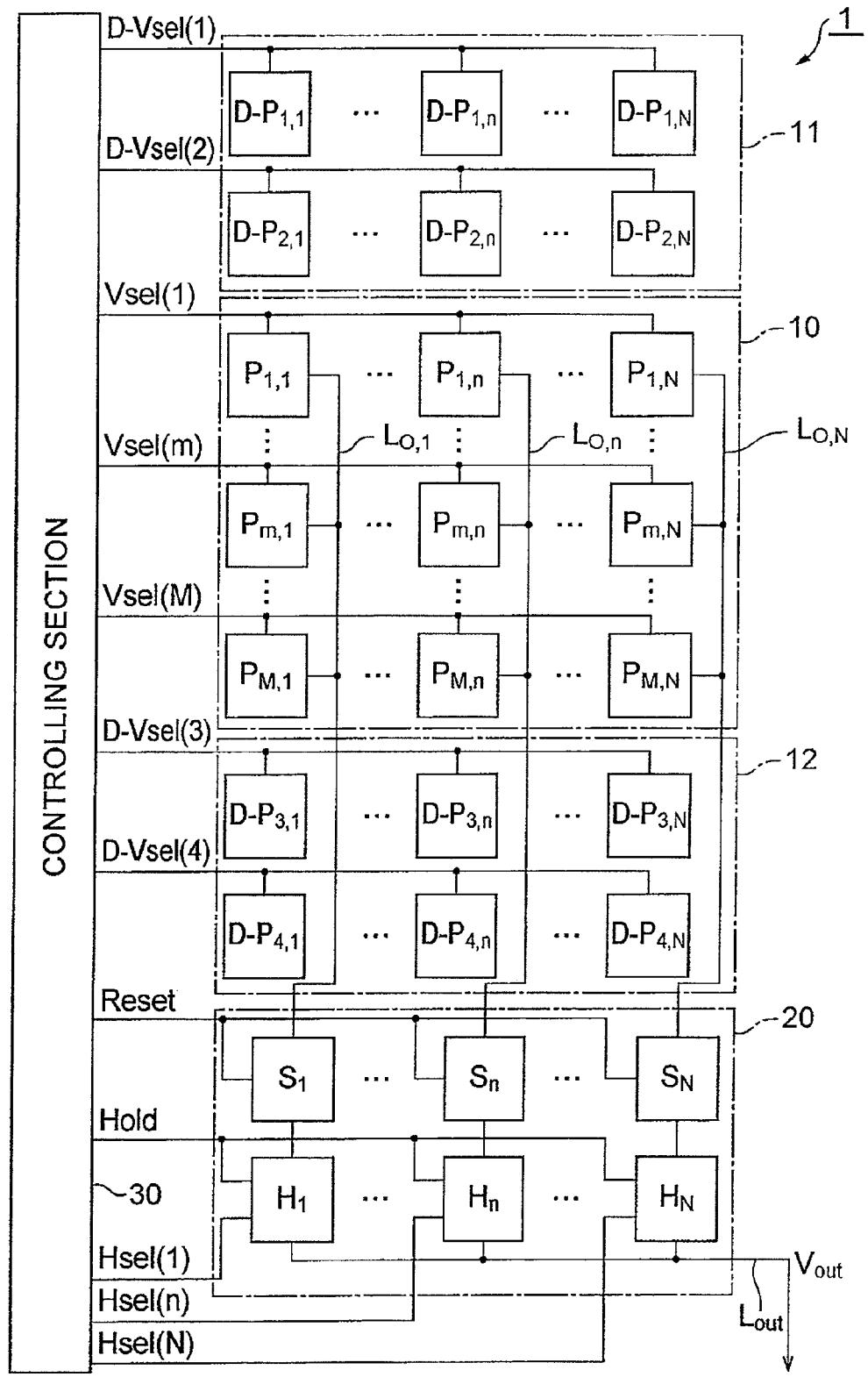
FIG. 2 is a configuration view of the solid state imaging device 1 of the present embodiment.

FIG. 2 is a configuration view of the solid state imaging device 1 of the present embodiment. In this figure, the photodetecting section 10, the dummy photodetecting sections 11 and 12, the signal readout section 20, and the controlling section 30 are shown.

The photodetecting section 10 includes M×N pixel portions $P_{1,1}$ to $P_{M,N}$ two-dimensionally arrayed in M rows and N columns. A pixel portion $P_{m,n}$ is positioned on the m-th row in the n-th column. Here, M and N are integers not less than 2, and M is smaller than N. m is integers not less than 1 and not more than M, and n is integers not less than 1 and not more than N. The pixel portions $P_{m,n}$ are a PPS (Passive Pixel Sensor) type and have a common configuration, and each includes a photodiode and a switch. N pixel portions $P_{m,1}$ to $P_{m,N}$ of the m-th row are connected to the controlling section 30 by a common control wire. Output terminals of M pixel portions $P_{1,n}$ to $P_{M,n}$ of the n-th column are connected to an integrating circuit $S_n$ included in the signal readout section 20 by an n-th column readout wiring $L_{O,n}$.

The signal readout section 20 includes N integrating circuits $S_1$ to $S_N$ and N holding circuits $H_1$ to $H_N$. The integrating circuits $S_n$ have a common configuration. The holding circuits $H_n$ have a common configuration.

Each integrating circuit $S_n$ has an input terminal connected to the readout wiring $L_{O,n}$, and accumulates charges input in this input terminal and outputs a voltage value corresponding to the accumulated charge amount from an output terminal to the holding circuit $H_n$. N integrating circuits $S_1$ to $S_N$ are connected to the controlling section 30 by a common control wiring.

Each holding circuit $H_n$ has an input terminal connected to the output terminal of the integrating circuit $S_n$, and holds a voltage value input in this input terminal and outputs the held voltage value from an output terminal to the output wiring $L_{OUT}$. N holding circuits $H_1$ to $H_N$ are connected to the controlling section 30 by a common control wiring. The respective holding circuits $H_n$ are also connected to the controlling section 30 by individual control wirings.

The dummy photodetecting section 11 and the dummy photodetecting section 12 are provided so as to sandwich the photodetecting section 10 therebetween. The dummy photodetecting section 11 is provided on the side opposite to the signal readout section 20 with respect to the photodetecting section 10, and includes 2×N dummy pixel portions D-$P_{1,1}$ to D-$P_{2,N}$ two-dimensionally arrayed in 2 rows and N columns. The dummy photodetecting section 12 is provided between the photodetecting section 10 and the signal readout section 20, and includes 2×N dummy pixel portions D-$P_{3,1}$ to D-$P_{4,N}$ two-dimensionally arrayed in 2 rows and N columns. These 4×N dummy pixel portions D-$P_{1,1}$ to D-$P_{4,N}$ have a common configuration, and each includes a dummy photodiode. The control signals D-Vsel(1) to D-Vsel(4) shown in the figure are not necessary in the case of the first mode described later, but are necessary in the case of the second mode described later.

The controlling section 30 supplies an m-th row selecting control signal Vsel(m) to N pixel portions $P_{m,1}$ to $P_{m,N}$ of the m-th row. The M row selecting control signals Vsel(1) to Vsel(M) are successively set to significant values. The controlling section 30 includes a shift register for successively setting the M row selecting control signals Vsel(1) to Vsel(M) to significant values and outputting these. The row selecting sections 31 shown in FIG. 1 output these M row selecting control signals Vsel(1) to Vsel(M).

The controlling section 30 supplies an n-th column selecting control signal Hsel(n) to the holding circuit $H_n$. N column selecting control signals Hsel(1) to Hsel(N) are also successively set to significant values. The controlling section 30 includes a shift register for successively setting the N column selecting control signals Hsel(1) to Hsel(N) to significant values and outputting these. A column selection section which outputs N column selecting control signals Hsel(1) to Hsel(N) may be disposed between the signal readout section 20 and the bonding pad section 40 in the plan view of FIG. 1($a$).

The controlling section 30 supplies a discharge control signal Reset to the N integrating circuits $S_1$ to $S_N$, and supplies a holding control signal Hold to the N holding circuits $H_1$ to $H_N$.

The controlling section 30 controls opening and closing operations of switches included in M×N pixel portions $P_{1,1}$ to $P_{M,N}$ in the photodetecting section 10, and controls holding operations and output operations in the signal readout section 20. Accordingly, the controlling section 30 makes the signal readout section 20 repeatedly output voltage values corresponding to amounts of charges generated in photodiodes included in the M×N pixel portions $P_{1,1}$ to $P_{M,N}$ in the photodetecting section 10 to the signal readout section 20 as frame data.

The solid state imaging device 1 includes discharging means for discharging junction capacitance portions of dummy photodiodes included in the dummy pixel portions $D\text{-}P_{1,1}$ to $D\text{-}P_{4,N}$ of the dummy photodetecting sections 11 and 12. This discharging means may discharge the junction capacitance portion of the dummy photodiode by applying a fixed voltage to this dummy photodiode (first mode), or discharges the junction capacitance portion of the dummy photodiode by control by the controlling section 30 as in the case of discharging the junction capacitance portion of the photodiode included in each pixel portion $P_{m,n}$ (second mode). Hereinafter, the first mode and the second mode of the discharging means are described, respectively.

Figure 3:
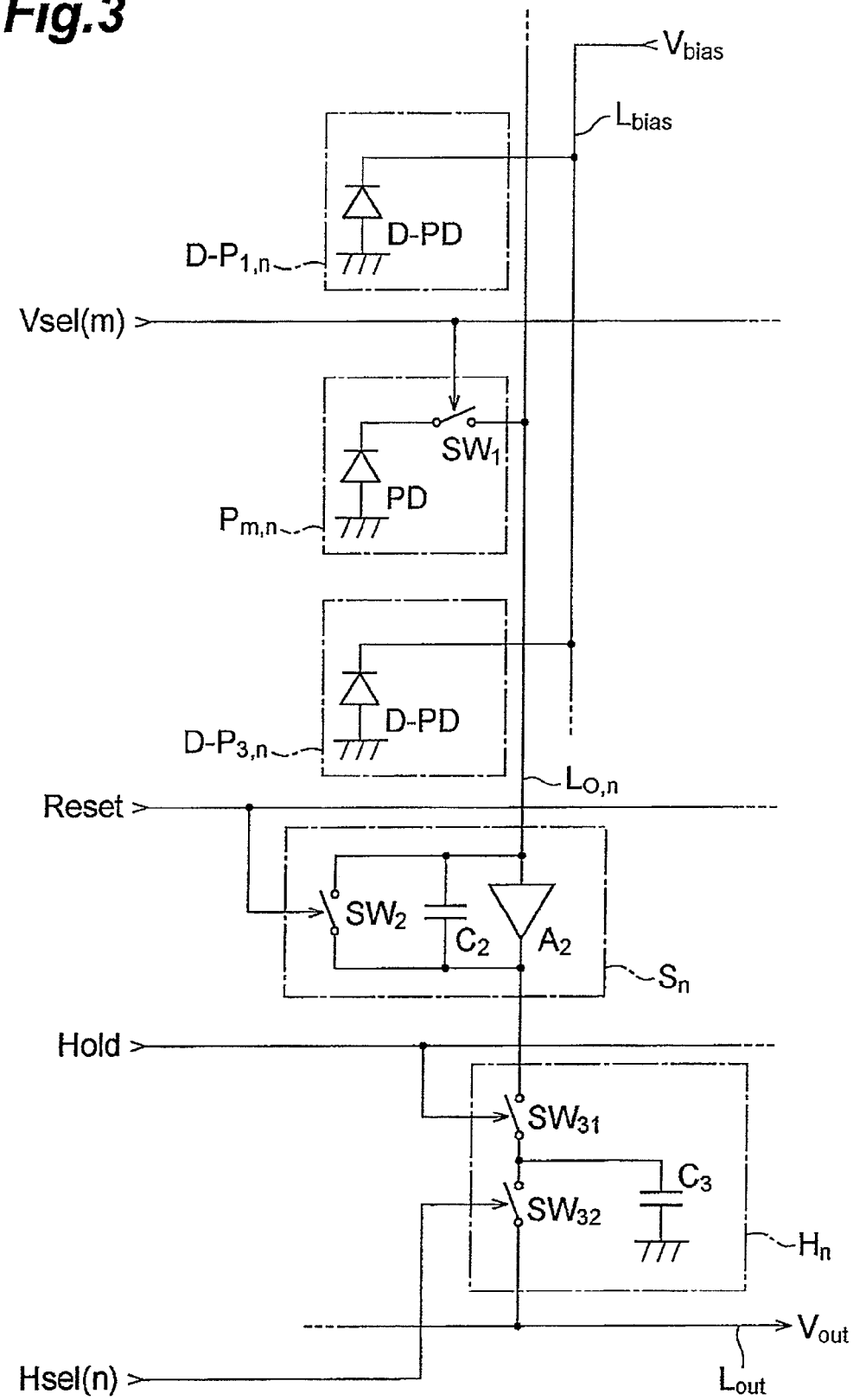
FIG. 3 is a circuit diagram of a first mode of the solid state imaging device 1 of the present embodiment.

First, the first mode of the solid state imaging device 1 of the present embodiment will be described with reference to FIG. 3 and FIG. 4. FIG. 3 is a circuit diagram of the first mode of the solid state imaging device 1 of the present embodiment. In this figure, circuit diagrams of the dummy pixel portion $D\text{-}P_{1,n}$, the pixel portion $P_{m,n}$, the dummy pixel portion $D\text{-}P_{3,n}$, the integrating circuit $S_n$, and the holding circuit $H_n$ are shown. Here, a circuit diagram of a pixel portion $P_{m,n}$ as a representative of M×N pixel portions $P_{1,1}$ to $P_{M,N}$, a circuit diagram of an integrating circuit $S_n$ as a representative of the N integrating circuits $S_1$ to $S_N$ is shown, and a circuit diagram of a holding circuit $H_n$ as a representative of the N holding circuits $H_1$ to $H_N$ is shown. In other words, a circuit portion concerning the pixel portion $P_{m,n}$ on the m-th row in the n-th column and the n-th column readout wiring $L_{O,n}$ is shown. Further, a dummy pixel portion $D\text{-}P_{1,n}$ as a representative of 2×N dummy pixel portions $D\text{-}P_{1,1}$ to $D\text{-}P_{2,N}$ included in the dummy photodetecting section 11 is shown, and a dummy pixel portion $D\text{-}P_{3,n}$ as a representative of the 2×N dummy pixel portions $D\text{-}P_{3,1}$ to $D\text{-}P_{4,N}$ included in the dummy photodetecting section 12 is shown.

The pixel portion $P_{m,n}$ includes a photodiode PD and a switch $SW_1$. The anode terminal of the photodiode PD is grounded. Cathode terminals of photodiodes PD included in M pixel portions $P_{1,n}$ to $P_{M,n}$ of the n-th column are connected to an n-th column readout wiring $L_{O,n}$ via switches $SW_1$. The photodiode PD generates charges as much as incident light intensity, and accumulates the generated charges in the junction capacitance portion. The switch $SW_1$ of the pixel portion $P_{m,n}$ is supplied with an m-th row selecting control signal Vsel(m) from the controlling section 30. The m-th row selecting control signal Vsel(m) instructs opening and closing operations of the switches $SW_1$ included in the N pixel portions $P_{m,1}$ to $P_{m,N}$ of the m-th row in the photodetecting section 10.

In this pixel portion $P_{m,n}$, when the m-th row selecting control signal Vsel(m) is at low level, the readout switch $SW_1$ opens, and charges generated in the photodiode PD are not output to the n-th column readout wiring $L_{O,n}$ but are accumulated in the junction capacitance portion. On the other hand, when the m-th row selecting control signal Vsel(m) is at high level, the readout switch $SW_1$ closes, and charges generated in the photodiode PD and accumulated in the junction capacitance portion until then are output to the n-th column readout wiring $L_{O,n}$ through the readout switch $SW_1$.

The n-th column readout wiring $L_{O,n}$ is connected to the readout switches $SW_1$ included in M pixel portions $P_{1,n}$ to $P_{M,n}$ of the n-th column in the photodetecting section 10. The n-th column readout wiring $L_{O,n}$ reads out charges generated in the photodiode PD included in any of the M pixel portions $P_{1,n}$ to $P_{M,n}$ via the readout switch $SW_1$ included in the pixel portion, and transfers the charges to the integrating circuit $S_n$.

The integrating circuit $S_n$ includes an amplifier $A_2$, an integrating capacitive element $C_2$, and a discharge switch $SW_2$. The integrating capacitive element $C_2$ and the discharge switch $SW_2$ are connected in parallel to each other, and provided between an input terminal and an output terminal of the amplifier $A_2$. The input terminal of the amplifier $A_2$ is connected to the n-th column readout wiring $L_{O,n}$. The discharge switch $SW_2$ is supplied with a discharge control signal Reset from the controlling section 30. The discharge control signal Reset instructs opening and closing operations of the discharge switches $SW_2$ included in N integrating circuits $S_1$ to $S_N$.

In this integrating circuit $S_n$, when the discharge control signal Reset is at high level, the discharge switch $SW_2$ closes and the integrating capacitive element $C_2$ is discharged, and a voltage value to be output from the integrating circuit $S_n$ is initialized. When the discharge control signal Reset is at low level, the discharge switch $SW_2$ opens, and charges input in the input terminal are accumulated in the integrating capacitive element $C_2$, and a voltage value corresponding to the accumulated charge amount is output from the integrating circuit $S_n$.

The holding circuit $H_n$ includes an input switch $SW_{31}$, an output switch $SW_{32}$, and a holding capacitive element $C_3$. One end of the holding capacitive element $C_3$ is grounded. The other end of the holding capacitive element $C_3$ is connected to the output terminal of the integrating circuit $S_n$, via the input switch $SW_{31}$, and connected to the voltage output wiring $L_{out}$ via the output switch $SW_{32}$. The input switch $SW_{31}$ is supplied with a holding control signal Hold from the controlling section 30. The holding control signal Hold instructs opening and closing operations of input switches $SW_{31}$ included in the N holding circuits $H_1$ to $H_N$. The output switch $S_{32}$ is supplied with an n-th column selecting control signal Hsel(n) from the controlling section 30. The n-th column selecting control signal Hsel(n) instructs opening and closing operations of the output switch $SW_{32}$ included in the holding circuit $H_n$.

In this holding circuit $H_n$, when the holding control signal Hold switches from high level to low level, the input switch $SW_{31}$ switches from a closed state to an open state, and a voltage value input in the input terminal at this time is held by the holding capacitive element $C_3$. When the n-th column selecting control signal Hsel(n) is at high level, the output switch $SW_{32}$ closes and the voltage value held by the holding capacitive element $C_3$ is output to the voltage output wiring $L_{out}$.

Each of the dummy pixel portions $D\text{-}P_{1,1}$ to $D\text{-}P_{4,N}$ includes a dummy photodiode D-PD. The anode terminal of the dummy photodiode D-PD is grounded. The cathode terminal of the dummy photodiode D-PD is connected to a bias voltage supply wiring $L_{bias}$, and a bias voltage value $V_{bias}$ which is a fixed voltage value is applied thereto. By applying this bias voltage value $V_{bias}$, the junction capacitance portion of the dummy photodiode D-PD is discharged and initialized.

The controlling section 30, instructs temporary closing and then opening of discharge switches $SW_2$ included in the N integrating circuits $S_1$ to $S_N$ by the discharge control signal Reset, and then instructs closing of the readout switches $SW_1$ included in the N pixel portions $P_{m,1}$ to $P_{m,N}$ of the m-th row in the photodetecting section 10 for a predetermined period by an m-th row selecting control signal Vsel(m). The controlling section 30 instructs switching of the input switches $SW_{31}$ included in the N holding circuits $H_1$ to $H_N$ from a closed state to an open state by a holding control signal Hold in the predetermined period. Then, after the predetermined period, the controlling section 30 instructs successive closing of the output switches $SW_{32}$ included in the N holding circuits $H_1$ to $H_N$ for a predetermined period by column selecting control signals Hsel(1) to Hsel(N). The controlling section 30 performs the above-described control for the rows in order.

Figure 4:
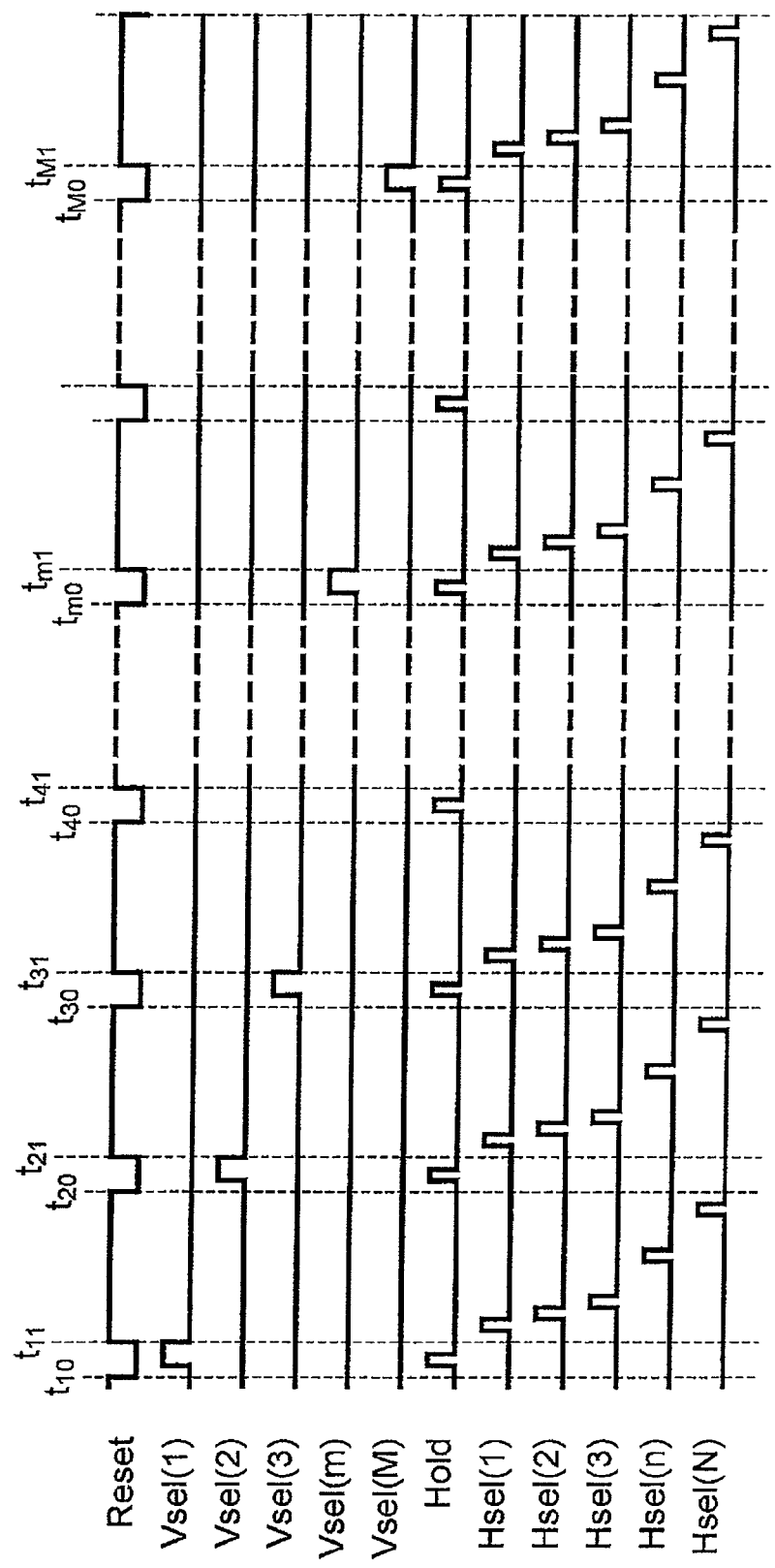
FIG. 4 is a timing chart describing operations of the first mode of the solid state imaging device 1 of the present embodiment.

FIG. 4 is a timing chart describing operations of the first mode of the solid state imaging device 1 of the present embodiment. In the solid state imaging device 1 of the present embodiment, under control by the controlling section 30, according to level changes of the M row selecting control signals Vsel(1) to Vsel(M), the N column selecting control signals Hsel(1) to Hsel(N), the discharge control signal Reset, and the holding control signal Hold at predetermined timings, light made incident on the photodetecting section 10 can be imaged and frame data can be obtained.

This figure shows, in order from the top, (a) the discharge control signal Reset for instructing opening and closing operations of the discharge switches $SW_2$ included in N integrating circuits $S_1$ to $S_N$, (b) the first row selecting control signal Vsel(1) for instructing opening and closing operations of the readout switches $SW_1$ included in the N pixel portions $P_{1,1}$ to $P_{1,N}$ of the first row in the photodetecting section 10, (c) the second row selecting control signal Vsel(1) for instructing opening and closing operations of the readout switches $SW_1$ included in the N pixel portions $P_{2,1}$ to $P_{2,N}$ of the second row in the photodetecting section 10, (d) the third row selecting control signal Vsel(3) for instructing opening and closing operations of the readout switches $SW_1$ included in the N pixel portions $P_{3,1}$ to $P_3,N$ of the third row in the photodetecting section 10, (e) the m-th row selecting control signal Vsel(m) for instructing opening and closing operations of the switches $SW_1$ included in the N pixel portions $P_{m,1}$ to $P_{m,N}$ of the m-throw in the photodetecting section 10, and (f) the M-th row selecting control signal Vsel(M) for instructing opening and closing operations of the switches $SW_1$ included in the N pixel portions $P_{M,1}$ to $P_{M,N}$ of the M-th row in the photodetecting section 10.

This figure further shows, subsequently in order, (g) the holding control signal Hold for instructing opening and closing operations of the input switches $SW_{31}$ included in the N holding circuits $H_1$ to $H_N$, (h) the first column selecting control signal Hsel(1) for instructing opening and closing operations of the output switch $SW_{32}$ included in the holding circuit $H_1$, (i) the second column selecting control signal Hsel(2) for instructing opening and closing operations of the output switch $SW_{32}$ included in the holding circuit $H_2$, (j) the third column selecting control signal Hsel(3) for instructing opening and closing operations of the output switch $SW_{32}$ included in the holding circuit $H_3$, (k) the n-th column selecting control signal Hsel(n) for instructing opening and closing operations of the output switch $SW_{32}$ included in the holding circuit $H_n$, and (l) the N-th column selecting control signal Hsel(N) for instructing opening and closing operations of the output switch $SW_{32}$ included in the holding circuit $H_N$.

Charges generated in the photodiodes PD included in the N pixel portions $P_{1,1}$ to $P_{1,N}$ of the first row and accumulated in the junction capacitance portions are read out as follows. Before the time $t_{10}$, the M row selecting control signals Vsel(1) to Vsel(M), N column selecting control signals Hsel(1) to Hsel(N), and the holding control signal Hold are at low level. Before the time $t_{10}$, the discharge control signal Reset to be output from the controlling section 30 becomes high level, and accordingly, in the N integrating circuits $S_1$ to $S_N$, the discharge switches $SW_2$ close and the integrating capacitive elements $C_2$ are discharged to initialize the output voltage values.

During the period from the time $t_{10}$ to the time $t_{11}$, the discharge control signal Reset becomes low level, and accordingly, in the N integrating circuits $S_1$ to $S_N$, the discharge switches $SW_2$ open and enable charges to be accumulated in the integrating capacitive elements $C_2$. During a predetermined period in the period from the time $t_{10}$ to the time $t_{11}$, the first row selecting control signal Vsel(1) to be output from the controlling section 30 becomes high level, and accordingly, the switches $SW_1$ included in the N pixel portions $P_{1,1}$ to $P_{1,N}$ of the first row in the photodetecting section 10 close. During a predetermined period in the period in which the first row selecting control signal Vsel(1) is at high level, the holding control signal Hold to be output from the controlling section 30 becomes high level, and accordingly, the input switches $SW_{31}$ in the N holding circuits $H_1$ to $H_N$ close.

In the period ($t_{10}$ to $t_{11}$), during a period in which the discharge control signal Reset is at low level and the first row selecting control signal Vsel(1) is at high level, the switch $SW_1$ included in each pixel portion $P_{1,n}$ of the first row is closed and the discharge switch $SW_2$ of each integrating circuit $S_n$ is open, so that charges generated in the photodiode PD of each pixel portion $P_{1,n}$ and accumulated in the junction capacitance portion until then are transferred to the integrating capacitive element $C_2$ of the integrating circuit $S_n$ through the switch $SW_1$ of the pixel portion $P_{1,n}$ and the n-th column readout wiring $L_{O,n}$ and accumulated. Then, a voltage value corresponding to the amount of charges accumulated in the integrating capacitive element $C_2$ of each integrating circuit $S_n$ is output from the output terminal of the integrating circuit $S_n$.

In the period ($t_{10}$ to $t_{11}$), the holding control signal Hold switches from high level to low level, and accordingly, in each of the N holding circuits $H_1$ to $H_N$, the input switch $SW_{31}$ switches from a closed state to an open state, and the voltage value output from the output terminal of the integrating circuit $S_n$ and input in the input terminal of the holding circuit $H_n$ at this time is held by the holding capacitive element $C_3$.

After this period, in the period ($t_{11}$ to $t_{20}$), the column selecting control signals Hsel(1) to Hsel(N) to be output from the controlling section 30 successively become high level for a predetermined period, and accordingly, the output switches $SW_{32}$ included in the N holding circuits $H_1$ to $H_N$ successively close for the predetermined period, and voltage values held by the holding capacitive elements $C_3$ of the respective holding circuits $H_n$ are successively output to the voltage output wiring $L_{out}$ through the output switches $SW_{32}$. These voltage values $V_{out}$ to be output to the voltage output wiring $L_{out}$ indicate the received light intensities in the photodiodes PD included in the N pixel portions $P_{1,1}$ to $P_{1,N}$ of the first row.

Subsequently, charges generated in the photodiodes PD included in the N pixel portions $P_{2,1}$ to $P_{2,N}$ of the second row and accumulated in the junction capacitance portions are read out as follows.

During the period from the time $t_{20}$ to the time $t_{21}$, the discharge control signal Reset becomes low level, and accordingly, in each of the N integrating circuits $S_1$ to $S_N$, the discharge switch $SW_2$ opens and enables charges to be accumulated in the integrating capacitive elements $C_2$. During a predetermined period in the period from the time $t_{20}$ to the time $t_{21}$, the second row selecting control signal Vsel(2) to be output from the controlling section 30 becomes high level, and accordingly, the readout switches $SW_1$ included in the N pixel portions $P_{2,1}$ to $P_{2,N}$ of the second row in the photodetecting section 10 close. In a predetermined period in the period in which the second row selecting control signal Vsel (2) is at high level, the holding control signal Hold to be output from the controlling section 30 becomes high level, and accordingly, the input switches $SW_{31}$ in the N holding circuits $H_1$ to $H_N$ close.

In the period ($t_{20}$ to $t_{21}$), during a period in which the discharge control signal Reset is at low level and the second row selecting control signal Vsel(2) is at high level, the switch $SW_1$ included in each pixel portion $P_{2,n}$ of the second row is closed and the discharge switch $SW_2$ of each integrating circuit $S_n$ is open, so that charges generated in the photodiode PD of each pixel portion $P_{2,n}$ and accumulated in the junction capacitance portion until then are transferred to the integrating capacitive element $C_2$ of the integrating circuit $S_n$ through the switch $SW_1$ of the pixel portion $P_{2,n}$ and the n-th column readout wiring $L_{O,n}$ and accumulated. Then, a voltage value corresponding to the amount of charges accumulated in the integrating capacitive element $C_2$ of each integrating circuit $S_n$ is output from the output terminal of the integrating circuit $S_n$.

In the period ($t_{20}$ to $t_{21}$), according to switching of the holding control signal Hold from high level to low level, in each of the N holding circuits $H_1$ to $H_N$, the input switch $SW_{31}$ switches from a closed state to an open state, and the voltage value output from the output terminal of the integrating circuit $S_n$ and input in the input terminal of the holding circuit $H_n$ at this time is held by the holding capacitive element $C_3$.

After this period, in the period ($t_{21}$ to $t_{30}$), the column selecting control signals Hsel(1) to Hsel(N) to be output from the controlling section 30 successively become high level for a predetermined period, and accordingly, the output switches $SW_{32}$ included in the N holding circuits $H_1$ to $H_N$ successively close for the predetermined period, and voltage values held by the holding capacitive elements $C_3$ of the respective holding circuits $H_n$ are successively output to the voltage output wiring $L_{out}$ through the output switches $SW_{32}$. These voltage values $V_{out}$ to be output to the voltage output wiring $L_{out}$ indicate the received light intensities in the photodiodes PD included in the N pixel portions $P_{2,1}$ to $P_{2,N}$ of the second row.

Subsequently to the above-described operation for the first row and the second row, the same operation is performed for the third to M-th rows, and frame data showing an image which is obtained by one imaging is obtained. When the operation for the M-th row is finished, the same operation is performed again in order from the first row, and frame data showing a next image is obtained. Thus, by repeating the same operation with a predetermined period, voltage values $V_{out}$ indicating two-dimensional intensity distribution of the light in the photodetecting section 10 are output to the voltage output wiring $L_{out}$, and frame data is repeatedly obtained.

While the frame data is repeatedly obtained as described above, if radiation and scintillation light transmitted through the scintillator layer 50 are made incident on a peripheral region (for example, the signal readout section 20, the controlling section 30, and the wire bonding section 40, etc.) other than the photodetecting section 10, charges may also be generated at the incidence position. Particularly, when the scintillator layer 50 is formed by vapor deposition on the surface of the semiconductor substrate 2, the peripheral edge portion of the scintillator layer 50 becomes thin and easily transmits radiation, so that noise charges are easily caused. Further, as shown in the plan view of FIG. 1(a), when the photodetecting section 10 is longer in the left-right direction than in the up-down direction, the signal readout section 20 and the wire bonding section 40 are disposed in the peripheral region on the upper side or the lower side of the photodetecting section 10, and the area of the peripheral region in which these members are disposed becomes larger than the area of the photodetecting section 10, and accordingly, noise charges are also easily caused in this peripheral region. Further, noise charges may be caused by heating in the amplifier included in the signal readout section 20.

Noise charges generated in peripheral regions may move from the generation position toward the photodetecting section 10. However, in the present embodiment, the dummy photodetecting sections 11 and 12 each including dummy photodiodes D-PD are provided, so that the noise charges are accumulated in the junction capacitance portions of the dummy photodiodes D-PD. In the first mode, a fixed voltage is applied to the dummy photodiode to discharge and initialize the junction capacitance portion of the dummy photodiode, so that entrance of the noise charges into the photodetecting section 10 is suppressed. Accordingly, in the solid state imaging device 1 of the present embodiment, an accurate radiation image is obtained.

Figure 5:
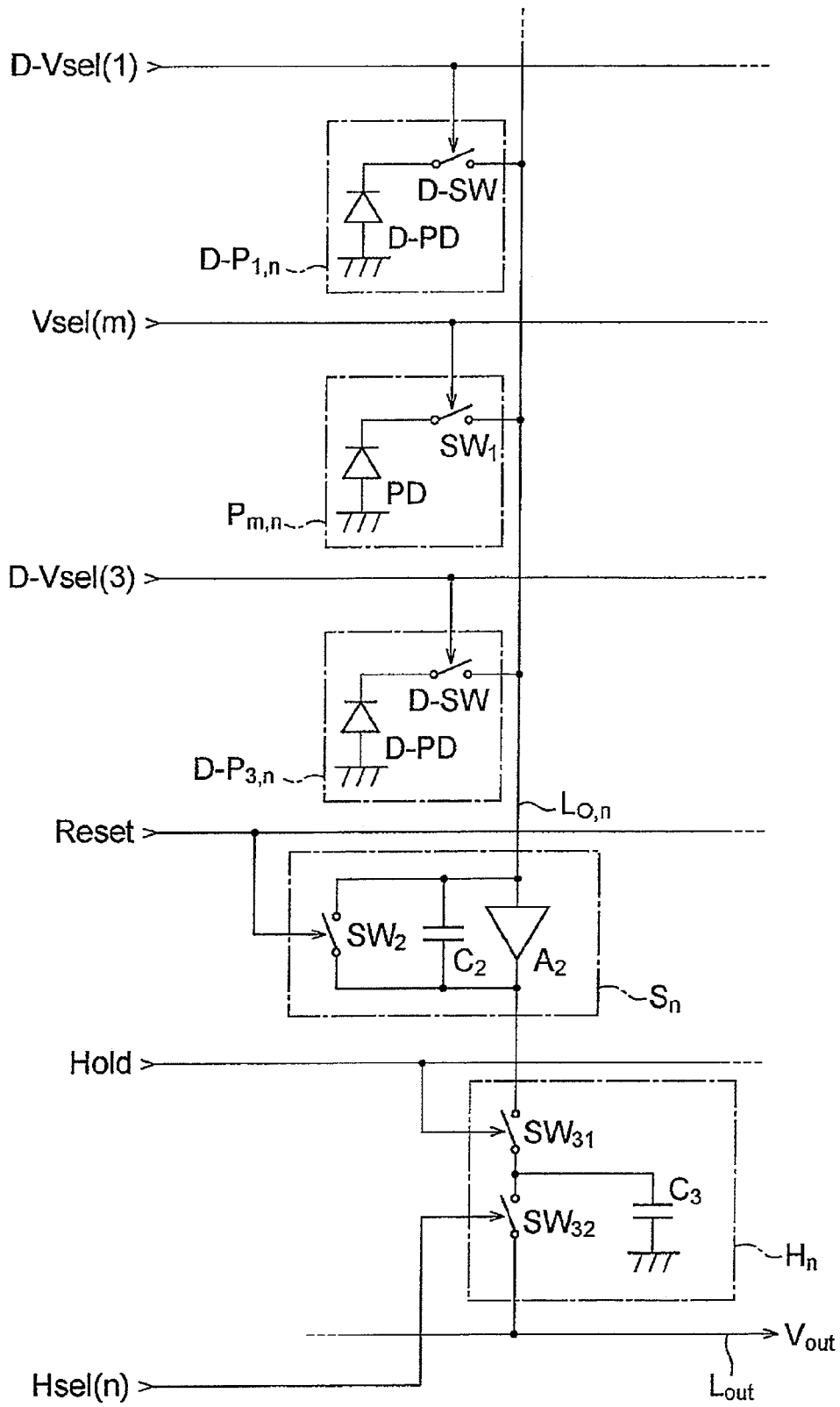
FIG. 5 is a circuit diagram of a second mode of the solid state imaging device 1 of the present embodiment.

Next, the second mode of the solid state imaging device 1 of the present embodiment will be described with reference to FIG. 5 and FIG. 6. FIG. 5 is a circuit diagram of the second mode of the solid state imaging device 1 of the present embodiment. In this figure, circuit diagrams of a dummy pixel portion $D-P_{1,n}$, a pixel portion $P_{m,n}$, a dummy pixel portion $D-P_{3,n}$, an integrating circuit $S_n$, and a holding circuit $H_n$ are shown. Here, a circuit diagram of a pixel portion $P_{m,n}$ as a representative of the M×N pixel portions $P_{1,1}$ to $P_{M,N}$ is shown, a circuit diagram of an integrating circuit $S_n$ as a representative of the N integrating circuits $S_1$ to $S_N$ is shown, and a circuit diagram of a holding circuit $H_n$ as a representative of the N holding circuits $H_1$ to $H_N$ is shown. In other words, a circuit portion concerning the pixel portion $P_{m,n}$ on the m-th row in the n-th column and the n-th column readout wiring $L_{o,n}$ is shown. Further, a dummy pixel portion $D-P_{1,n}$ as a representative of the 2×N dummy pixel portions $D-P_{1,1}$ to $D-P_{2,N}$ included in the dummy photodetecting section 11 is shown, and a dummy pixel portion $D-P_{3,n}$ as a representative of the 2×N dummy pixel portions $D-P_{3,1}$ to $D-P_{4,N}$ included in the dummy photodetecting section 12 is shown.

In comparison with the configuration of the first mode shown in FIG. 3, the configuration of the second mode shown in FIG. 5 is different in the configuration of the 4×N dummy pixel portions $D-P_{1,1}$ to $D-P_{4,N}$, and different in connection of these dummy pixel portions. Each of the dummy pixel portions $D-P_{1,1}$ to $D-P_{4,N}$ includes a dummy photodiode D-PD and a dummy switch D-SW. The anode terminal of the dummy photodiode D-PD is grounded. Cathode terminals of dummy photodiodes D-PD included in four dummy pixel portions $D-P_{1,n}$ to $D-P_{4,n}$ of the n-th column are connected to an n-th column readout wiring $L_{O,n}$ via the dummy switches D-SW.

Opening and closing operations of the dummy switches D-SW of the N dummy pixel portions $D-P_{1,1}$ to $D-P_{1,N}$ are controlled by a control signal D-Vsel(1) output from the controlling section 30. Opening and closing operations of dummy switches D-SW of N dummy pixel portions $D-P_{2,1}$ to $D-P_{2,N}$ are controlled by a control signal D-Vsel(2) output from the controlling section 30. Opening and closing operations of dummy switches D-SW of N dummy pixel portions D-P$_{3,1}$ to D-P$_{3,N}$ are controlled by a control signal D-Vsel(3) output from the controlling section 30. Opening and closing operations of dummy switches D-SW of N dummy pixel portions D-P$_{4,1}$ to D-P$_{4,N}$ are controlled by a control signal D-Vsel(4) output from the controlling section 30.

Figure 6:
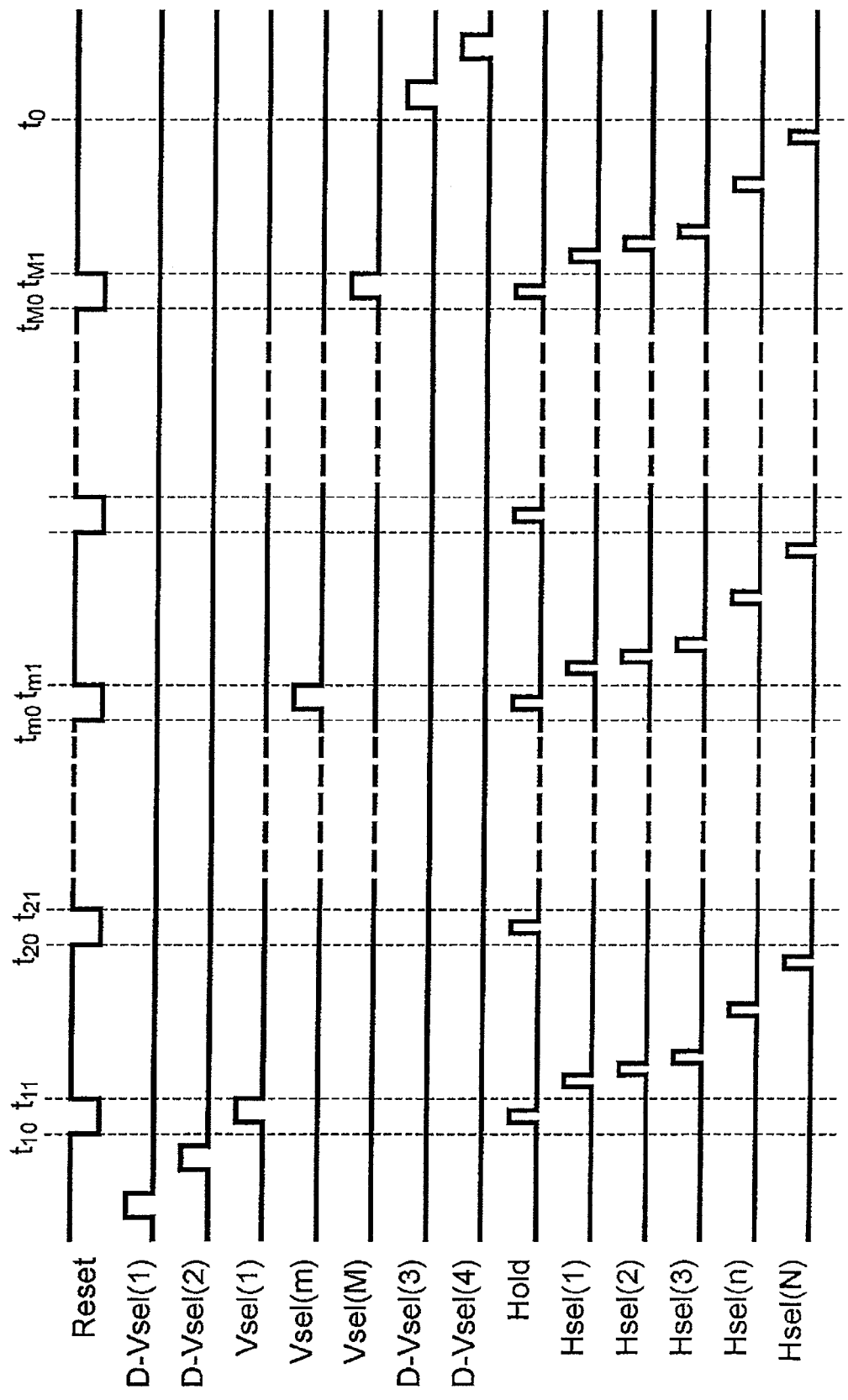
FIG. 6 is a timing chart describing operations of the second mode of the solid state imaging device 1 of the present embodiment.

FIG. 6 is a timing chart describing operations of the second mode of the solid state imaging device 1 of the present embodiment. In the solid state imaging device 1 of the present embodiment, under control by the controlling section 30, according to level changes of the M row selecting control signals Vsel(1) to Vsel(M), the N column selecting control signals Hsel(1) to Hsel(N), the discharge control signal Reset, the holding control signal Hold and four control signals D-Vsel(1) to D-Vsel(4) at predetermined timings, light made incident on the photodetecting section 10 can be imaged and frame data can be obtained.

In the flowchart of the second mode shown in FIG. 6, in comparison with the timing chart of the first mode shown in FIG. 4, four control signals D-Vsel(1) to D-Vsel(4) are additionally shown. The operations from the time $t_{10}$ to the time $t_0$ in the flowchart of the second mode shown in FIG. 6 are the same as the operations for the first to M-th rows of the photodetecting section 10 in the flowchart of the first mode shown in FIG. 4.

In the second mode, in a period in which the discharge control signal Reset is at high level before the time $t_{10}$ at which the operation for the first row of the photodetecting section 10 starts, the control signal D-Vsel(1) and the control signal D-Vsel(2) become high level for a predetermined period. In the second mode, in a period in which the discharge control signal Reset is at high level after the time $t_0$ at which the operation for the M-th row of the photodetecting section 10 is finished, the control signal D-Vsel(3) and the control signal D-Vsel(4) become high level for a predetermined period.

When the discharge control signal Reset is at high level, in the N integrating circuits S$_1$ to S$_N$, the discharge switches SW$_2$ close, the integrating capacitive elements C$_2$ are discharged, and the output voltage values are initialized. At this time, when the control signal D-Vsel(1) becomes high level, in the N dummy pixel portions D-P$_{1,1}$ to D-P$_{1,N}$ of the dummy photodetecting section 11, the dummy switches D-SW close and the junction capacitance portions of the dummy photodiodes D-PD are discharged and initialized. When the control signal D-Vsel(2) becomes high level, in the N dummy pixel portions D-P$_{2,1}$ to D-P$_{2,N}$ of the dummy photodetecting section 11, the dummy switches D-SW close and the junction capacitance portions of the dummy photodiodes D-PD are discharged and initialized. When the control signal D-Vsel(3) becomes high level, in the N dummy pixel portions D-P$_{3,1}$ to D-P$_{3,N}$ of the dummy photodetecting section 12, the dummy switches D-SW close and the junction capacitance portions of the dummy photodiodes D-PD are discharged and initialized. When the control signal D-Vsel(4) becomes high level, in the N dummy pixel portions D-P$_{4,1}$ to D-P$_{4,N}$ of the dummy photodetecting section 12, the dummy switches D-SW close and the junction capacitance portions of the dummy photodiodes D-PD are discharged and initialized.

In the second mode, noise charges generated in a peripheral region may also move from the generation position toward the photodetecting section 10. However, in the present embodiment, the dummy photodetecting sections 11 and 12 each including dummy photodiodes D-PD are provided, so that the noise charges are accumulated in the junction capacitance portions of the dummy photodiodes D-PD. In the second mode, by closing the dummy switches D-SW of the dummy pixel portions D-P$_{1,1}$ to D-P$_{4,N}$ and discharging the capacitive elements C$_2$ of the integrating circuits S$_n$, the junction capacitance portions of the dummy photodiodes D-PD are discharged and initialized, so that entrance of the noise charges into the photodetecting section 10 is suppressed. Accordingly, an accurate radiation image can be obtained in the solid state imaging device 1 of the present embodiment.

In the first mode, a bias voltage supply wiring L$_{bias}$ for applying a fixed bias voltage value V$_{bias}$ to the dummy photodiodes D-PD of the dummy pixel portions D-P$_{1,1}$ to D-P$_{4,N}$ is necessary, however, in the second mode, this bias voltage supply wiring L$_{bias}$ is not necessary. Therefore, the aperture ratio in the photodetecting section 10 can be made higher in the second mode than in the first mode.

The present invention is not limited to the above-described embodiment, but can be variously varied. For example, each of the dummy photodetecting sections 11 and 12 includes 2×N dummy pixel portions two-dimensionally arrayed in 2 rows and N columns, however, the number of rows is not limited to 2 but may be 1, or may be more.

Figure 7:
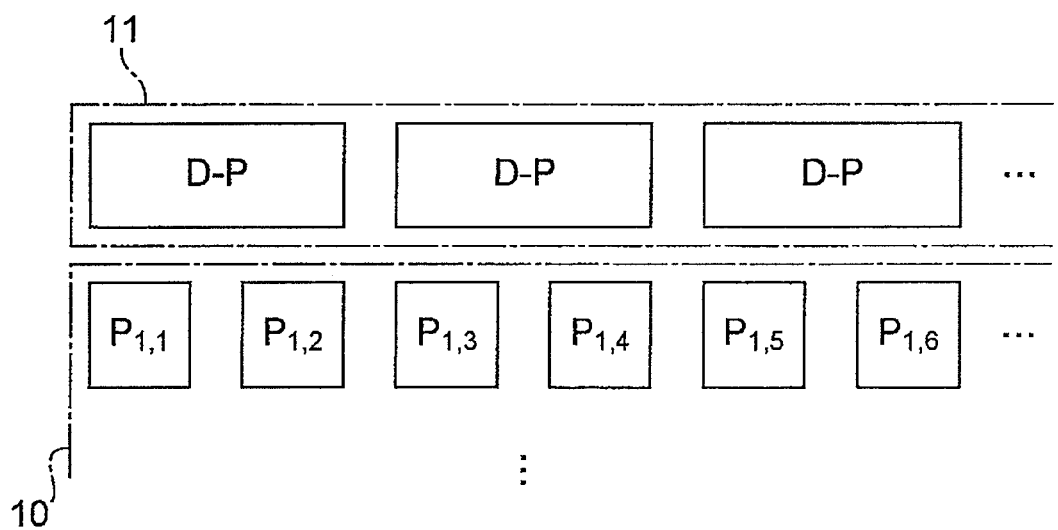
FIG. 7 is a view showing an exemplary variation of the solid state imaging device 1 of the present embodiment.
Figure 8:
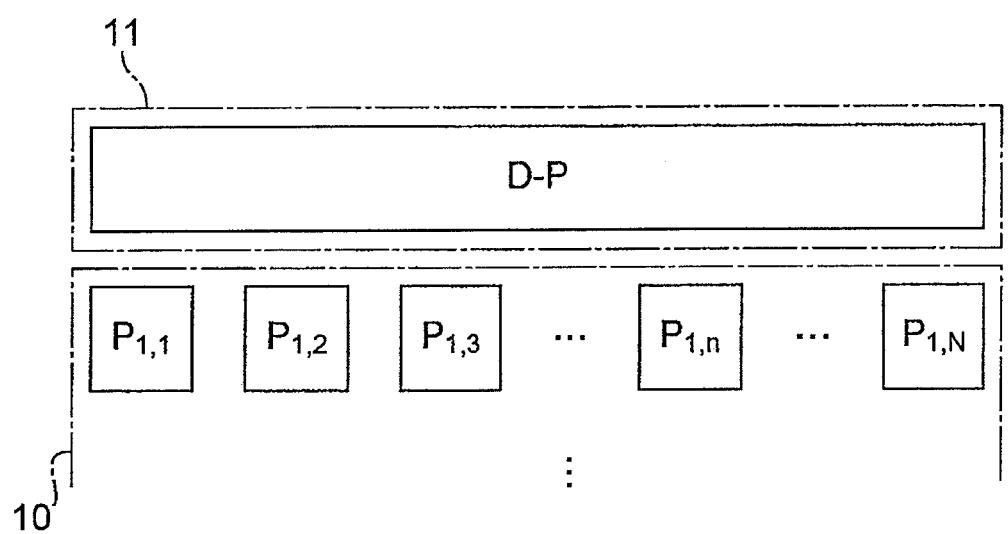
FIG. 8 is a view showing an exemplary variation of the solid state imaging device 1 of the present embodiment.

In each of the dummy photodetecting sections 11 and 12, N dummy pixel portions are arrayed on each row in the above-described embodiment, however, the number of dummy pixel portions on each row is not limited to N, and may be less than N, or more than N. In each of the dummy photodetecting sections 11 and 12, when dummy pixel portions less than N are arrayed on each row, the area of the photosensitive region of one dummy photodiode D-PD included in each dummy pixel portion D-P is preferably larger than the area of the photosensitive region of one photodiode PD included in each pixel portion P$_{m,n}$ (see FIG. 7). It is also allowed that, in each of the dummy photodetecting sections 11 and 12, one dummy pixel portion D-P is provided on each row, and the photosensitive region of the dummy photodiode D-PD included in the dummy pixel portion D-P extends in the left-right direction (see FIG. 8).

Figure 9:
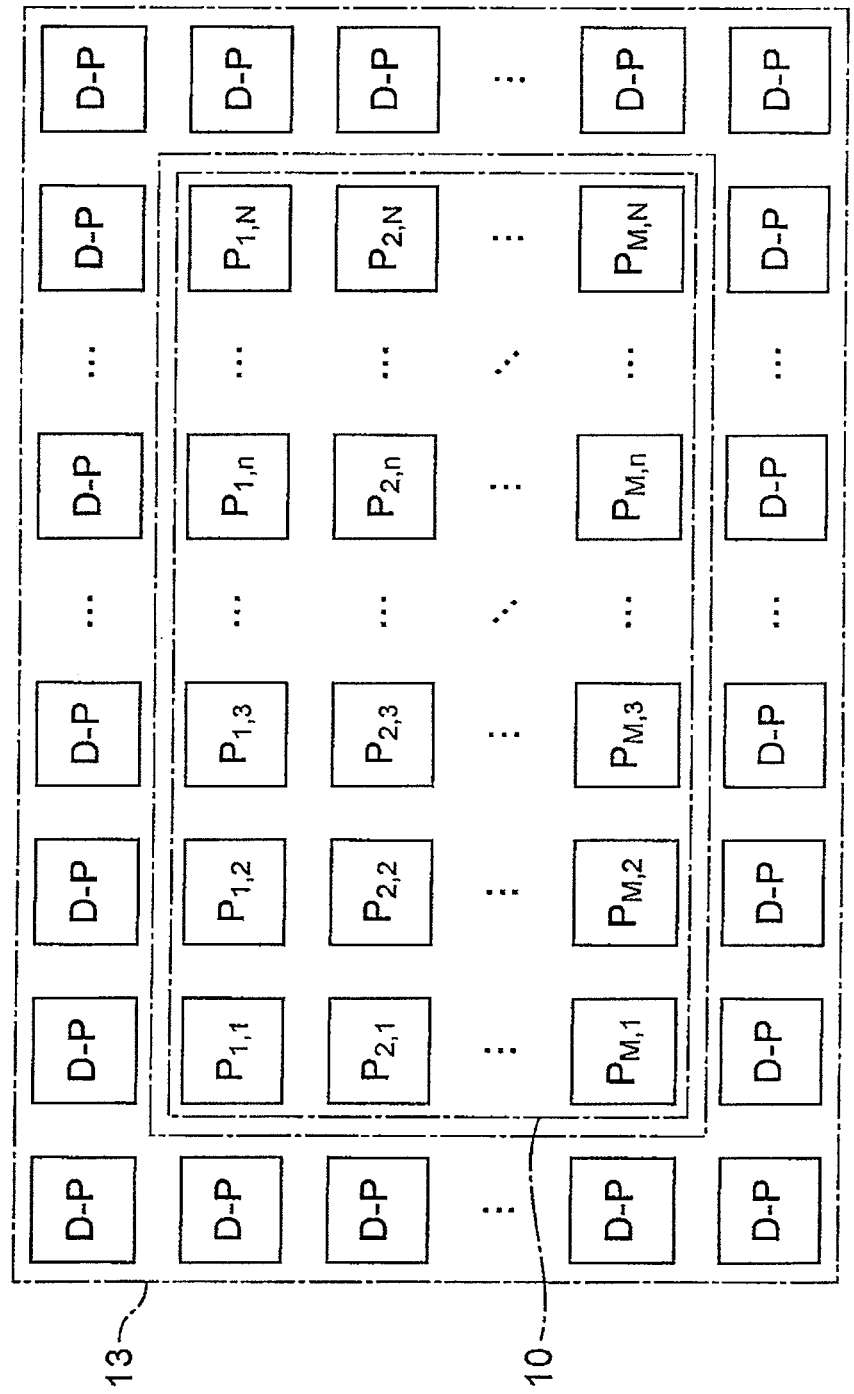
FIG. 9 is a view showing an exemplary variation of the solid state imaging device 1 of the present embodiment.

The dummy photodetecting section including the dummy photodiode may be not only provided so as to neighbor the outer sides of the first and M-th rows of the photodetecting section 10, but may also be provided so as to neighbor the outer side of the first column or the N-th column of the photodetecting section 10. Alternatively, a dummy photodetecting section 13 may be disposed so as to surround the periphery of the photodetecting section 10 (see FIG. 9). In the dummy photodetecting section neighboring the outer side of the first column or the N-th column of the photodetecting section 10, the number of rows and the number of columns of the arrayed dummy photodiodes are also arbitrary, and the size and shape of the photosensitive regions of the dummy photodiodes are also arbitrary. The photosensitive region of one dummy photodiode may be disposed so as to surround the photodetecting section 10.

The invention claimed is:
1. A solid state imaging device comprising:
 a photodetecting section including M×N pixel portions P$_{1,1}$ to P$_{M,N}$ two-dimensionally arrayed in M rows and N columns, each including a photodiode which generates charges as much as incident light intensity and a switch connected to the photodiode, where the photodiode is connected to a readout wiring L$_{O,n}$ via the switch in each pixel portion P$_{m,n}$;
 a scintillator layer which is provided so as to cover the photodetecting section and generates scintillation light in response to incidence of radiation;
 a dummy photodetecting section including dummy photodiodes disposed so as to neighbor the outer sides of the first row and the M-th row of the photodetecting section;

a signal readout section which is provided on the outer side of the first row or the M-th row of the photodetecting section, includes N integrating circuits $S_1$ to $S_N$ and N holding circuits $H_1$ to $H_N$, accumulates charges input into each integrating circuit $S_n$ through the readout wiring $L_{O,n}$ in a capacitive element and outputs a voltage value corresponding to the accumulated charge amount, and holds the voltage value output from the integrating circuit $S_n$ in each holding circuit $H_n$ and outputs the voltage value; and a bias voltage supply wiring connected to the dummy photodiodes, wherein the bias voltage supply wiring discharges the junction capacitance portion of the dummy photodiodes by applying a fixed voltage to the dummy photodiodes, where M and N are integers not less than 2, M<N, m is an integer not less than 1 and not more than M, and n is an integer not less than 1 and not more than N, wherein the photodetecting section, the dummy photodetecting section, and the signal readout section are formed on a same semiconductor substrate, and wherein a peripheral region other than the photodetecting section of the semiconductor substrate is larger than an area formed by the photodetection section.

2. The solid state imaging device according to claim 1, wherein
the dummy photodetecting section includes dummy photodiodes disposed on a plurality of rows neighboring the first row and the M-th row of the photodetecting section.

3. The solid state imaging device according to claim 1, wherein the area of a photosensitive region of one dummy photodiode is larger than the area of a photosensitive region of one photodiode included in each pixel portion Pm,n.

4. The solid state imaging device according to claim 1, wherein the dummy photodetecting section further includes a dummy photodiode disposed so as to neighbor the outer side of the first column or the N-th column of the photodetecting section.

5. The solid state imaging device according to claim 1, wherein the photodetecting section, the dummy photodetecting section, and the signal readout section are formed on the semiconductor substrate by using a CMOS technique.

6. The solid state imaging device according to claim 1, wherein the signal readout section extends in the row direction.

7. A solid state imaging device comprising:
a photodetecting section including M×N pixel portions $P_{1,1}$ to $P_{M,N}$ two-dimensionally arrayed in M rows and N columns, each including a photodiode which generates charges as much as incident light intensity and a switch connected to the photodiode, where the photodiode is connected to a readout wiring $L_{O,n}$ via the switch in each pixel portion $P_{m,n}$;
a scintillator layer which is provided so as to cover the photodetecting section and generates scintillation light in response to incidence of radiation;
a dummy photodetecting section including dummy photodiodes disposed so as to neighbor the outer sides of the first row and the M-th row of the photodetecting section; and
a signal readout section which is provided on the outer side of the first row or the M-th row of the photodetecting section, includes N integrating circuits $S_1$ to $S_N$ and N holding circuits $H_1$ to $H_N$, accumulates charges input into each integrating circuit $S_n$ through the readout wiring $L_{O,n}$ in a capacitive element and outputs a voltage value corresponding to the accumulated charge amount, and holds the voltage value output from the integrating circuit $S_n$ in each holding circuit $H_n$ and outputs the voltage value, wherein the dummy photodetecting section further includes dummy switches connected to the dummy photodiodes, and the dummy photodiode is connected to any of the N integrating circuits $S_1$ to $S_N$ by any of the N readout wirings $L_{O,1}$ to $L_{O,N}$ via the dummy switch, a controlling section switches the dummy switch to a closed state, and discharges the junction capacitance portion of the dummy photodiode by discharging a capacitive element of the integrating circuit to which the dummy photodiode is connected among the N integrating circuits $S_1$ to $S_N$, the photodetecting section, the dummy photodetecting section, and the signal readout section are formed on a same semiconductor substrate, and a peripheral region other than the photodetecting section of the semiconductor substrate is larger than an area formed by the photodetection section.

8. The solid state imaging device according to claim 7, wherein
the dummy photodetecting section includes dummy photodiodes disposed on a plurality of rows neighboring the first row and the M-th row of the photodetecting section.

9. The solid state imaging device according to claim 7, wherein the area of a photosensitive region of one dummy photodiode is larger than the area of a photosensitive region of one photodiode included in each pixel portion $P_{m,n}$.

10. The solid state imaging device according to claim 7, wherein the dummy photodetecting section further includes a dummy photodiode disposed so as to neighbor the outer side of the first column or the N-th column of the photodetecting section.

11. The solid state imaging device according to claim 7, wherein the photodetecting section, the dummy photodetecting section, and the signal readout section are formed on the semiconductor substrate by using a CMOS technique.

12. The solid state imaging device according to claim 7, wherein the controlling section inputs row selecting control signals to the pixel portions of the photodetecting section, and
wherein the dummy switches are connected to the controlling section.

13. The solid state imaging device according to claim 7, wherein the signal readout section extends in the row direction.

14. A solid state imaging device comprising:
a photodetecting section including M×N pixel portions $P_{1,1}$ to $P_{M,N}$ two-dimensionally arrayed in M rows and N columns, each including a photodiode which generates charges corresponding to an incident light intensity and a switch connected to the photodiode, the photodiode being connected to a readout wiring $L_{O,n}$ via the switch in each pixel portion $P_{m,n}$;
a scintillator layer is configured to cover the photodetecting section and generates scintillation light in response to incidence of radiation;
a dummy photodetecting section including dummy photodiodes disposed so as to neighbor the photodetecting section; and
a signal readout section which is provided on the outer side of the first row or the M-th row of the photodetecting section, includes N integrating circuits $S_1$ to $S_N$ and N holding circuits $H_1$ to $H_N$, accumulates charges input into each integrating circuit $S_n$ through the readout wiring $L_{O,n}$ in a capacitive element and outputs a voltage value corresponding to the accumulated charge amount, and holds the voltage value output from the integrating circuit $S_n$ in each holding circuit $H_n$ and outputs the voltage value, where M and N are integers not less than 2, M<N, m in an integer not less than 1 and not more the M, and n is an integer not less than 1 and not more than N, wherein the dummy photodetecting section is arranged between the signal readout section and the photodetecting section, the dummy photodiodes are connected to a bias voltage supply wiring, a fixed voltage is applied to the dummy photodiodes via the bias voltage supply wiring to discharge the junction capacitance portions of the dummy photodiodes, the photodetecting section, the dummy photodetecting section, and the signal readout section are formed on a same semiconductor substrate, and a peripheral region other than the photodetecting section of the semiconductor substrate is larger than an area formed by the photodetection section.

15. The solid state imaging device according to claim 14, wherein
the dummy photodetecting section includes dummy photodiodes disposed on a plurality of rows neighboring the first row and the M-th row of the photodetecting section.

16. The solid state imaging device according to claim 15, wherein
the dummy photodetecting section further includes a dummy photodiode disposed so as to neighbor the outer side of the first column or the N-th column of the photodetecting section.

17. The solid state imaging device according to claim 14, wherein the area of a photosensitive region of a dummy photodiode is larger than the area of a photosensitive region of a photodiode included in each pixel portion $P_{m,n}$.

18. The solid state imaging device according to claim 14, wherein the signal readout section extends in the row direction.

19. A solid state imaging device comprising:
a photodetecting section including photodiodes;
a scintillator layer that covers the photodetecting section;
a signal readout section including:
   an integrating circuit connected to the photodiode of the photodetecting section, and
   a holding circuit connected to an output of the integrating circuit,
a dummy photodetecting section including dummy photodiodes, arranged between the signal readout section and the photodetecting section, and
a bias voltage supply wiring connected to the dummy photodiodes, the dummy photodiodes are discharged by applying a fixed bias voltage to the dummy photodiodes via the bias voltage supply wiring;
wherein the photodetecting section, the dummy photodetecting section, and the signal readout section are formed on a same semiconductor substrate, and
wherein a peripheral region other than the photodetecting section of the semiconductor substrate is larger than an area formed by the photodetection section.

20. A solid state imaging device comprising:
a photodetecting section including photodiodes;
a scintillator layer that covers the photodetecting section;
a signal readout section including,
   an integrating circuit connected to the photodiode of the photodetecting section, and
   a holding circuit connected to an output of the integrating circuit; and
a dummy photodetecting section including dummy photodiodes and dummy switches, arranged between the signal readout section and the photodetecting section,
wherein the dummy switches are connected to corresponding dummy photodiodes, respectively, and the dummy photodiodes are discharged by closing a corresponding dummy switch to connect a readout wiring;
wherein the photodetecting section, the dummy photodetecting section, and the signal readout section are formed on a same semiconductor substrate, and
wherein a peripheral region other than the photodetecting section of the semiconductor substrate is larger than an area formed by the photodetection section.

* * * * *